United States Patent [19]

Farmer

[11] 4,153,456

[45] May 8, 1979

[54] METHOD OF PRODUCING HIGH QUALITY PHOTOGRAPHS ON MICROFICHE

[75] Inventor: William C. Farmer, Metamora, Ill.

[73] Assignee: High Point, Incorporated, Peoria, Ill.

[21] Appl. No.: 826,528

[22] Filed: Aug. 22, 1977

[51] Int. Cl.[2] .......................... G03C 5/04; G03F 5/00; G03C 1/58

[52] U.S. Cl. ....................................... 96/27 R; 96/45; 96/49

[58] Field of Search ................................ 96/27, 45, 49

[56] References Cited

U.S. PATENT DOCUMENTS

| | | | |
|---|---|---|---|
| 3,218,165 | 11/1965 | Foote | 96/27 R |
| 3,589,899 | 6/1971 | Hersh | 96/45 |

OTHER PUBLICATIONS

Photographic Reproduction, Denstman & Schultz, 1963, pp. 135-158, 170-176.

Camera Copying & Reproduction, by Croy, 1964, pp. 221-222.

Kodagraph, Reproduction Materials, 1952, pp. 17-21, 1 Supplement 1-8.

*Primary Examiner*—Mary F. Kelley

*Attorney, Agent, or Firm*—Richard A. Zachar

[57] ABSTRACT

There is disclosed a method for producing improved quality photographs on microfilm and improved quality diazo microfiche duplicates. A negative half-tone image of a real world subject is produced on a photosensitive medium. A negative of that image is then formed on microfilm, such negative being a positive half-tone image of the real world subject. Diazo duplicates are then made, if desired, using the negative image (positive half-tone image of the real world subject) on the microfilm as the master.

4 Claims, 4 Drawing Figures

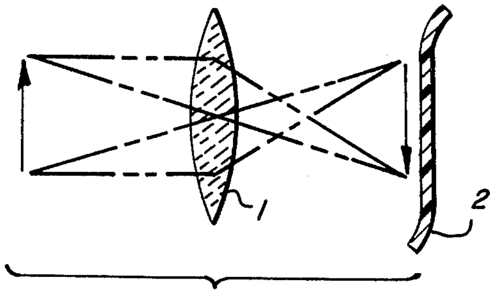
FIG. 1a
FIG. 1b
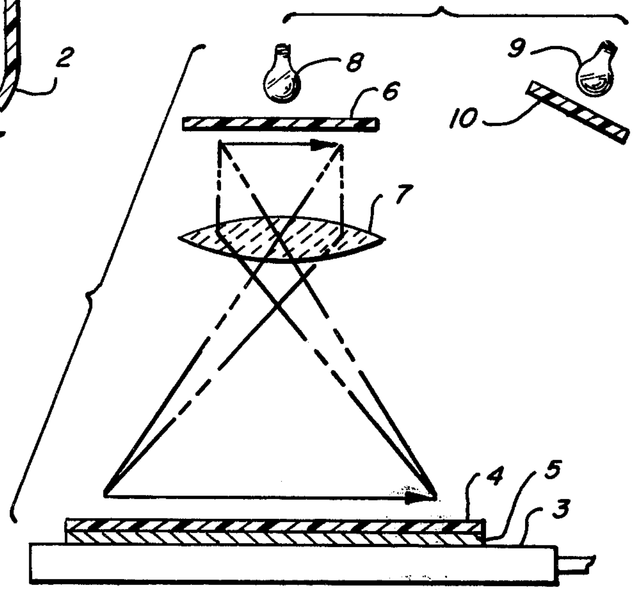
FIG. 1c
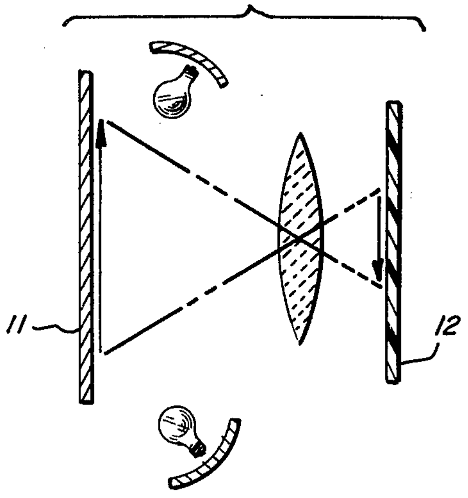
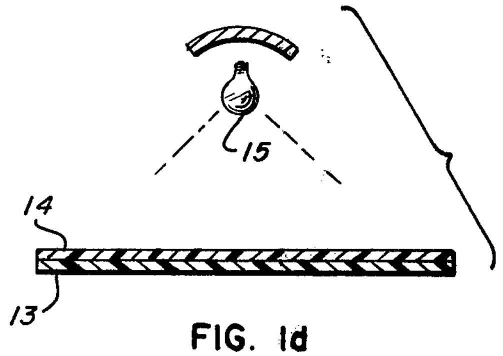
FIG. 1d

METHOD OF PRODUCING HIGH QUALITY PHOTOGRAPHS ON MICROFICHE

BACKGROUND OF THE INVENTION

The present invention relates to the art of photographic reproduction and, more particularly, to methods for producing photographs on microfilm and for producing duplicates thereof.

Definitions

As used herein, the following definitions apply to the terms listed below:

Continuous tone — Tone variation in a photographic image due to variations in blackness, or density, such as those seen in an ordinary snapshot.

Negative image — A photographic image of an optically preceding object wherein the tones are the reverse of those such optically preceding object.

Positive image — A photographic image of an optically preceding object wherein the tones are the same as those of the optically preceding object.

Real world subject — A real object of the real world as distinguished from a photographic reproduction thereof.

Negative polarity image — An image wherein the tones are the reverse of those of the real world subject (whether or not reverse of those of the optically preceding object, if any).

Positive polarity image — An image wherein the tones are the same of those of the real world subject (whether or not the same as those of the optically preceding object, if any).

Prior to the present invention, high quality duplicates of micrographic photographs could not be produced inexpensively. As a consequence of the high contrast nature of micrographic films and duplication media, especially diazo, when a continuous tone image is microfilmed, the shades of gray drop out with much loss of detail. The graphic arts industry has long utilized a technique known as half-tone photography to overcome a similar problem caused by the high contrast nature of the printing process.

Half-tone photographic methods have heretofore been utilized in the production of photographs on microfilm as well as in the production of duplicates. Nevertheless, it has been difficult to produce quality duplicates of microfilm images on relatively low cost diazo transparencies, such as fiche dups. Such requires a positive polarity microfilm master since a positive image is produced in the diazo duplication process. Where half-tone photographic methods have been applied, production of a positive polarity image on microfilm has required either full reversal processing or the production of an intermediate photographic copy. In either case the resultant positive polarity half-tone image on the microfilm suffers in quality due to the harsh chemistry utilized or by reason of the extra copy generation involved.

SUMMARY OF THE INVENTION

A method for producing improved quality photographs on microfilm in accordance with the present invention consists of the steps of producing a negative polarity half-tone image of a real world subject on a photosensitive medium, and thereafter producing a negative image thereof on microfilm. Diazo duplicates are then made, if desired, using the negative image on the microfilm as the master.

The negative polarity half-tone image of the real world subject is produced, in accordance with the presently preferred method through the production of a continuous tone negative polarity image of the real world subject on a transparency, such as by exposing 35mm film to the real world subject and developing the same in the conventional manner. Utilizing a condensor enlarger, the continuous tone negative polarity image is projected onto photomechanical paper overlaid with a contact screen by means of half-tone main and flash exposures. The photomechanical paper is conventionally processed to result in a positive half-tone print of the continuous tone negative, the positive half-tone print being a negative polarity half-tone image of the real world subject.

The positive half-tone print of the continuous tone negative may then be used in accordance with the invention as one of the original documents in a "step and repeat" camera in the production of a negative microfiche transparency (the microfiche transparency having positive polarity half-tone images thereon). From the microfiche transparency, diazo dups can be made in the conventional manner.

BRIEF DESCRIPTION OF THE DRAWINGS

The invention will now be further described by reference to the specification and the accompanying drawings, in which FIGS. 1A–1D are simplified schematic elevational views showing apparatus for carrying out the method of the present invention.

DETAILED DESCRIPTION

For purposes of illustrative disclosure the method of the present invention will be described in connection with the production of high quality positive polarity half-tone images of a real world subject on diazo microfiche.

As illustrated in FIG. 1A, light from the real world subject (illustrated as an arrow) to be ultimately reproduced on diazo microfiche is first focused by means of a suitable camera lens 1 so as to form an image thereof on light responsive transparent photographic material 2, such as conventional 35mm film. The exposed 35mm film is then conventionally developed to form a continuous tone negative transparency 6. Referring to FIG. 1B, an enlarged positive half-tone print of the continuous tone negative transparency is then produced. This can be accomplished by utilizing an open faced vacuum frame 3 to maintain a contact screen 4 in intimate contact with photomechanical paper or PMT material 5. The PMT material is exposed to light transmitted through the developed 35mm film 6, suitably focused by projection lens 7. It has been found that, when using 65 line screen, and a 60 watt tungsten light source 8 that a 10 second mean exposure can be used with a lens aperture of F8. Thereafter, the PMT material is exposed to a two and one-half second yellow flash exposure from a 7½ watt bulb 9 through a 00 filter 10 at a distance of four feet. The foregoing exposures are for a 5″×7″ enlargement from a normal 35mm negative transparency. As will be immediately apparent to those skilled in the art, the exposures referred to above must be adjusted for density changes between continuous tone negatives and enlarging sizes and the particular screen being utilized. Further, it must be recalibrated whenever deviations from the standard exposure occur such as, for example, (1) upon a change of the lamp 8, (2) when a new emulsion of PMT material is encountered, (3) when the lens 7 is changed, and (4) when the activator temperature varies 7% away from 68° F. In order to prevent a 180° phase shift care should be taken to position the film 6 and PMT material 5 with their emulsion sides facing the lamp 8.

As illustrated in FIG. 1C, the developed PMT material 11 is used as an original document in a conventional microfilm camera. A conventional step and repeat camera is utilized when microfiche is being produced. The image produced on the microfilm 12 is a negative half-tone image of the image produced on the developed PMT material. Because the image on the PMT material is a negative polarity half-tone reproduction of the real world subject, the image on the microfilm is a positive polarity half-tone image thereof.

As illustrated in FIG. 1D, diazo dups of the microfiche may be produced by placing the diazo 13 in contact with the developed microfilm 14 and exposing the same to ultraviolet light from a source 15 in the conventional manner.

It will be obvious to those skilled in the art that many modifications may be made within the scope of the present invention without departing from the spirit thereof, and the invention includes all such modifications.

What is claimed is:

1. In a method for producing a photograph of a real world subject on microfilm, the steps of producing a negative image of said subject on transparent material, producing a negative polarity half-tone image of said subject on a photosensitive medium by exposing said photosensitive material to focused light transmitted through said transparent material and through a photographic screen, exposing microfilm to said negative polarity half-tone image, and developing said microfilm to produce a negative image of said negative polarity half-tone image thereon.

2. In a method in accordance with claim 1 wherein said photosensitive material comprises photomechanical transfer paper.

3. In a method in accordance with claim 2 and further including utilizing the negative microfilm as the master to produce a diazo duplicate thereof.

4. In a method for producing duplicate diazo transparencies having a positive polarity image of a real world subject thereon, the steps of exposing transparent photosensitive material to light transmitted from said subject and developing the same to form a continuous tone negative image thereof, transmitting light through the developed transparency and focusing the same to form an image of said negative image at an image plane, locating contact screened photochemical transfer paper in said plane for exposure to a predetermined amount of said light being transmitted through the developed transparency, processsing said transfer paper with receiver paper to produce a negative polarity half-tone image of said subject on said receiver paper, producing a negative image of said negative polarity half-tone image on microfilm, and utilizing said microfilm as a master to produce by diazo duplication said duplicate diazo transparencies therefrom.

* * * * *